(12) United States Patent
Guest et al.

(10) Patent No.: US 7,190,363 B2
(45) Date of Patent: Mar. 13, 2007

(54) METHOD AND SYSTEM FOR PROCESSING GRAPHICS SIMULATION DATA

(75) Inventors: Stephen M. Guest, Benbrook, TX (US); Jeffrey W. Minor, Lake Orion, MI (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 11/258,566

(22) Filed: Oct. 24, 2005

(65) Prior Publication Data

US 2006/0038816 A1 Feb. 23, 2006

Related U.S. Application Data

(63) Continuation-in-part of application No. 10/191,354, filed on Jul. 8, 2002, now abandoned.

(51) Int. Cl.
*G06T 17/00* (2006.01)
(52) U.S. Cl. ...................................... 345/420
(58) Field of Classification Search ............... None
See application file for complete search history.

(56) References Cited

U.S. PATENT DOCUMENTS 5,459,868 A 10/1995 Fong
5,774,382 A * 6/1998 Tyler et al. ................ 703/2

FOREIGN PATENT DOCUMENTS

| EP | 1037142 A2 | 9/2000 |
|---|---|---|
| FR | 2807182 | 10/2001 |
| GB | 2253500 A | 9/1992 |
| WO | WO 02/25429 A2 | 3/2002 |

OTHER PUBLICATIONS

*General Exchange of Methods and Data at Lockheed Martin*, by Michael R. Yokell and William P. Pfeiffert, Siam Workshop on Object Oriented Methods for Interoperable Scientific and Engineering Computing, Oct. 1998.

*A Graphics Toolkit Based on Differential Constraints*, by Michael Gleicher, School of Computer Science, Carnegie Mellon University, Pittsburgh, PA , UIST. Proceedings of the Annual ACM Symposium on User Interface Software and Technology, Nov. 3, 1993.

(Continued)

Primary Examiner—Kee M. Tung
Assistant Examiner—Peter-Anthony Pappas
(74) Attorney, Agent, or Firm—Bracewell & Giuliani LLP

(57) ABSTRACT

A method and system for processing graphics simulation data is disclosed. Initially, a group of three-dimensional visual models to be rendered in a graphics simulation are constructed. Data that are utilized to move and control elements of the graphics simulation are acquired. The acquired data are subsequently converted to an object oriented format having tables and functions by automatically resolving dependencies between inputs and outputs of each of internal objects with external inputs and external outputs, respectively. Next, a link is established between the data in the object oriented format using the independent and dependent variables and the elements of the graphics simulation. Finally, the data in the object oriented format are processed via a graphics simulation.

16 Claims, 2 Drawing Sheets

OTHER PUBLICATIONS

*Interaction With Constraints in 3D Modeling,* by Wolfgang Sohrt, Beat D. Brüderlin, Department of Computer Science, University of Utah, Proceedings. Symposium on Solid Modeling Foundations and CAD/CAM Applications, Jun. 5, 1991.

*An Object-Oriented Representation for Product and Design Processes,* by S.R. Gortit, A. Guptat, G.J. Kim§, R.D. Sriram and A. Wong, Computer Aided Design, Elsevier Publishers BV., Barking, GB, Jun. 1, 1998.

*Highly Flexible Property Abstraction Framework of Non-Restricted System Object Model Objects,* IBM Technical Disclosure Bulletin, IBM Corp. New York, U.S., Sep. 1, 1994.

*Objects With Multi-Personality,* IBM Technical Disclosure Bulletin, IBM Corp. New York, U.S., Sep. 1, 1994.

* cited by examiner

METHOD AND SYSTEM FOR PROCESSING GRAPHICS SIMULATION DATA

CROSS REFERENCE TO RELATED APPLICATIONS

This is a continuation-in-part patent application which claims priority to and the benefit of U.S. patent application Ser. No. 10/191,354, filed on Jul. 8, 2002 now abandoned, titled "Method and System for Processing Graphics Simulation Data," incorporated herein by reference in its entirety.

BACKGROUND OF THE INVENTION

1. Field of the Invention

The present invention relates to data processing in general, and in particular to graphics processing within a data processing system. Still more particularly, the present invention relates to a method and system for processing graphics simulation data within a data processing system.

2. Description of the Related art

Advancements in computer-aided design technology enable engineers to run graphics simulations on a computer system to assist in the testing of physical properties of parts or systems. The ability to run graphics simulations of the physical properties of the parts or systems enables engineers to identify potential design flaws or deficiencies prior to their actual manufacture and/or implementation. But even after the manufacture and/or implementation, graphics simulations allow engineers to visualize certain failure modes based on the data collected from the actual parts or systems. For example, graphics simulations can be utilized to determine when and where a mechanical part will fail under load conditions, thereby enabling engineers to strengthen or modify the mechanical part to improve its performance.

Prior art graphics simulation methodologies typically fall under one of the following two categories. The first category requires graphics simulation software to be custom written specifically to control known elements of the graphics simulation. As a result, the graphics simulation software has to be recompiled for each unique element within a system. The second category allows simulation software to be a little more generic in the sense that the simulation software may not have to be recompiled for every unique graphics simulation, but each controllable element in a simulation is required to be defined by a rigid format and naming convention.

Consequently, it is desirable to provide an improved method for processing graphics simulation data within a data processing system.

SUMMARY OF THE INVENTION

In accordance with a preferred embodiment of the present invention, a group of three-dimensional visual models to be rendered in a graphics simulation are constructed. Data that are utilized to move and control elements of the graphics simulation are acquired. The acquired data are subsequently converted to an object oriented format having tables and functions by automatically resolving dependencies between inputs and outputs of each of internal objects with external inputs and external outputs, respectively. Next, a link is established between the data in the object oriented format using the independent and dependent variables and the elements of the graphics simulation. Finally, the data in the object oriented format are processed via a graphics simulation.

According to an embodiment of the present intention, a method for processing graphics simulation data within a data processing system is provided. The method can include the steps of constructing a plurality of three-dimensional visual models to be rendered in a graphics simulation, acquiring data that are utilized to move and control controllable elements of the graphics simulation, and converting the acquired data to an object oriented format having tables and functions defining an object oriented file by automatically resolving dependencies and order of operations between independent and dependent variables to generate top-level dependent variables based on a top-level independent variable. The method also includes establishing a link between the data in the object oriented file and the controllable elements of the graphics simulation, and processing the data in the object oriented file via the graphics simulation. The link can be established by identifying the object oriented file, top-level independent and dependent variables, type of visual simulation element to control, specific element in simulation to control, and top-level dependent variables necessary to enable manipulation of the visual simulation element. Further, the method can include the step of defining requirements for the graphics simulation which can include defining a basic layout of the graphics simulation, desired three-dimensional visual models to be used, simulation data to be acquired, user interaction requirements, and display requirements.

According to an embodiment of the present intention, a computer program product residing on a computer usable medium for processing graphics simulation data. A computer program product can include program code means for constructing a plurality of three-dimensional visual models to be rendered in a graphics simulation, program code means for acquiring data that are utilized to move and control controllable elements of the graphics simulation, and program code means for converting the acquired data to an object oriented format having tables and functions defining an object-oriented file, automatically resolving dependencies between lower level independent and dependent variables to generate top-level dependent variables based on a top-level independent variable. The computer program product can also include program code means for establishing a link between the data in the object oriented file using the independent and dependent variables and the controllable elements of the graphics simulation, and program code means for processing the data in the object oriented file via the graphics simulation.

A data processing system for processing graphics simulation data. The data processing system can include means for constructing a plurality of three-dimensional visual models to be rendered in a graphics simulation, means for acquiring data that are utilized to move and control controllable elements of the graphics simulation, and means for converting the acquired data to an object oriented format having tables and functions defining an object oriented file, automatically resolving dependencies and order of operations between lower level independent and dependent variables to generate a top-level dependent variable based on a top-level independent variable. The data processing system means for establishing a link between the data in the object oriented file and the elements of the graphics simulation, and means for processing the data in the object oriented file via the graphics simulation.

All objects, features, and advantages of the present invention will become apparent in the following detailed written description.

BRIEF DESCRIPTION OF THE DRAWINGS

So that the manner in which the features and advantages of the invention, as well as others which will become apparent, may be understood in more detail, a more particular description of the invention briefly summarized above may be had by reference to the embodiments thereof which are illustrated in the appended drawings, which form a part of this specification. It is to be noted, however, that the drawings illustrate only various embodiments of the invention and therefore are not to be considered limiting of the invention's scope as it may include other effective embodiments as well.

DETAILED DESCRIPTION OF A PREFERRED EMBODIMENT

The present invention will now be described more fully hereinafter with reference to the accompanying drawings, which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout. Prime notation, if used, indicates similar elements in alternative embodiments. Note, the term "adjacent" as used herein refers to a position that is within, on, or near the object referenced.

The present invention may be executed in a variety of computers under a number of different operating systems. The computer may be, for example, a personal computer, a midrange computer or a mainframe computer. In addition, the computer may be a stand-alone system or part of a network such as a local-area network (LAN) or a wide-area network (WAN).

Figure 1:
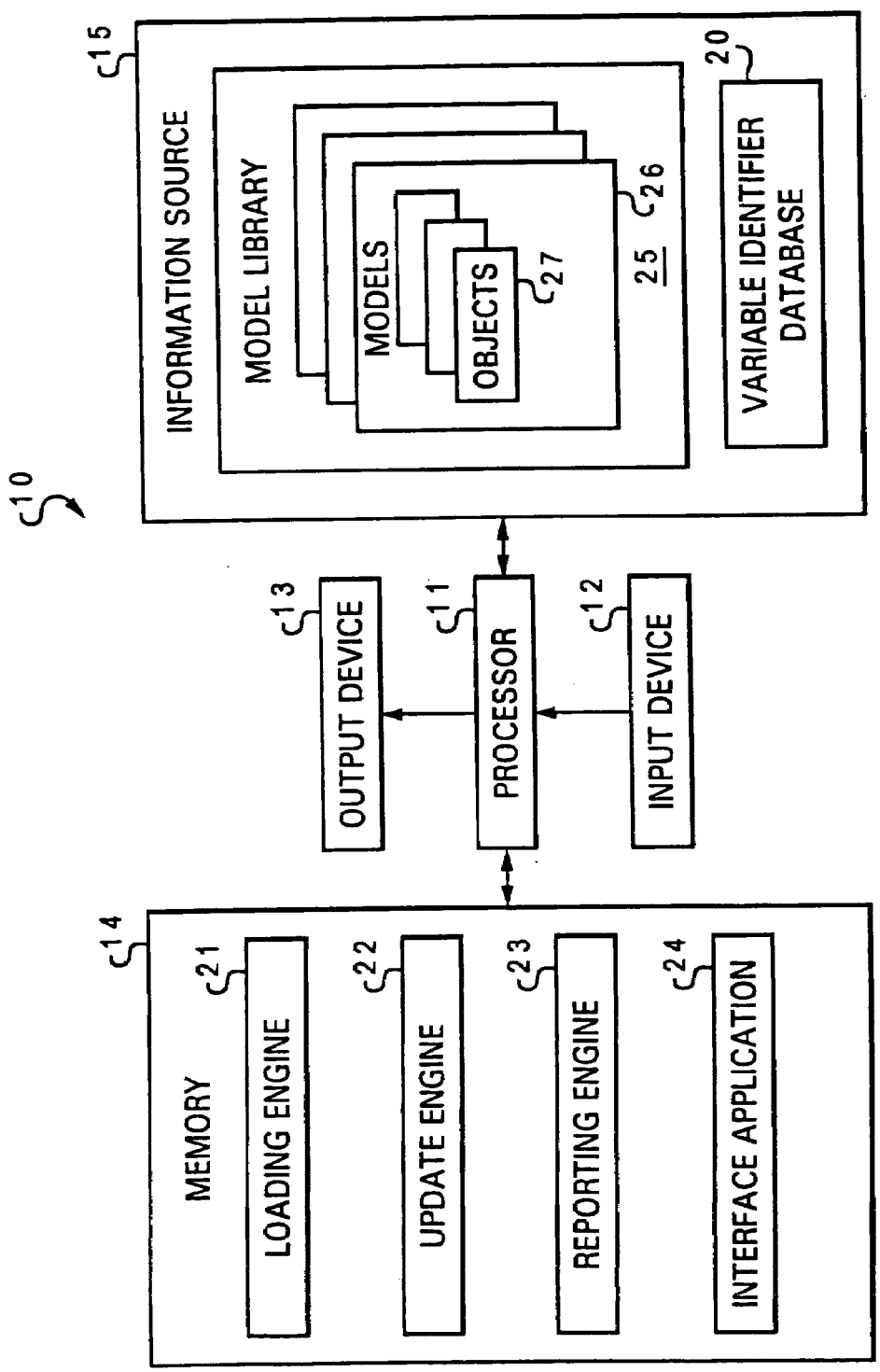
FIG. 1 is a block diagram of a data processing system in which a preferred embodiment of the present invention is applicable.

Referring now to the drawings and in particular to FIG. 1, there is illustrated a block diagram of a data processing system in which a preferred embodiment of the present invention is applicable. As shown, a data processing system 10 includes a processor 11, an input device 12, an output device 13, a memory 14, and an information source 15. Information, such as variable value data, may be received from a user via input device 12 such as a keyboard. Output values or results may be output to the user via output device 13 such as a display.

By way of example, information source 15 may comprise a model library 25 having one or more models 26 that may be selected by the user via input device 12. Each of models 26 include one or more cooperative collections of objects 27 to provide a simulation or analysis of selected information. However, models 26 may be otherwise configured to provide analysis, simulation or other user defined information processing parameters. Objects 27 generally include data sets, data tables, or functions for processing information according to a selected one of models 26. Each object 27 represents an instance of some class, and whose classes are all members of a hierarchy of classes united via inheritance relationships. Each object 27 includes an input variable and an output variable. Each object 27 is an identifiable, encapsulated piece of code and data that provide one or more services when requested by the user. Thus, based on an input variable value, object 27 provides an output variable value corresponding to the table, data set or function of object 27.

Information source 15 may also include a variable identifier database 20 having a unique identifier associated with each input variable and output variable of objects 27. For example, the unique identifier may include terminology, alphanumeric designations, phrases or other suitable identifiers to identify particular input variables and output variables of objects 27.

Software programs, such as a loading engine 21, an update engine 22, a reporting engine 23, and an interface application 24, are illustrated as being stored in memory 14 where they can be executed by processor 11. Loading engine 21, update engine 22, reporting engine 23, and interface application 24 may also be stored on a variety of other types of storage media.

Loading engine 21 processes information from information source 15 in preparation for evaluation of the information using update engine 22. Loading engine 21 automatically creates object links between each of the input variables and output variables of objects 27 of a selected one of models 26. Loading engine 21 may access variable identifier database 20 for each object 27 included within a particular one of models 26 to automatically determine the input and output variable of objects 27 and automatically link corresponding input and output variables of the objects 27.

Update engine 22 processes models 26 and automatically updates each object within a model sequentially to obtain output variable values of the user-selected model based on user-defined input variable values. For example, update engine 22 sequentially updates each object of a model to obtain output variable values for each of objects 27 without performing redundant calculations. Thus, a particular one of objects 27 may be updated when an output variable value of the updated object is required to support the update of another one of objects 27.

Reporting engine 23 may be used to display output variable values of a particular one of models 26 to the user via output device 13. For example, reporting engine 23 may provide output variable values in a particular format or structure as defined by the user via input device 12. However, reporting engine 23 may be otherwise used to display or provide output variable values to the user.

Interface application 24 may be used to receive input variable values from the user via input device 12 and automatically associate the data or input variable values received from the user to corresponding input variables of objects 27. However, input variable values may be otherwise received and associated with the corresponding input variables of objects 27.

Figure 2:
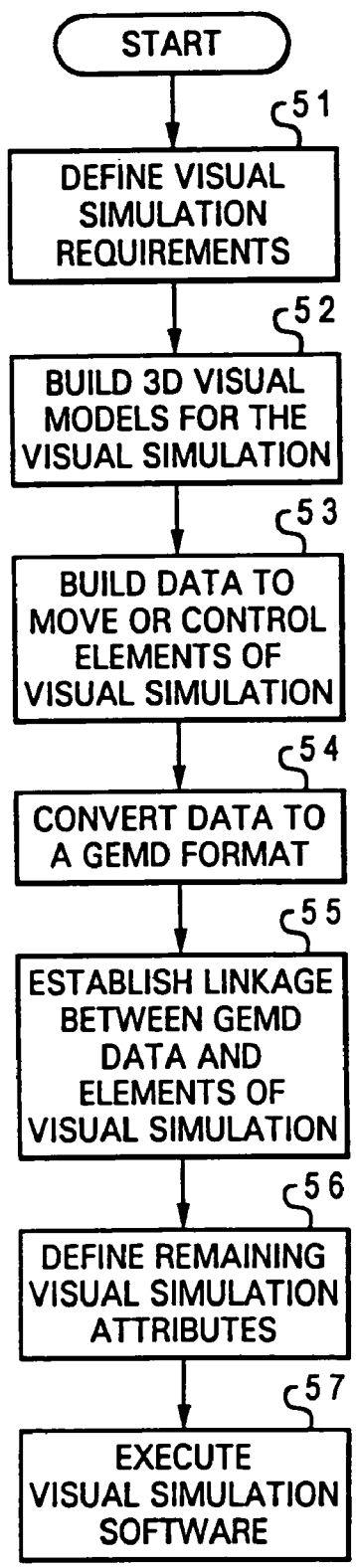
FIG. 2 is a high-level logic flow diagram of a method for processing graphics simulation data, in accordance with a preferred embodiment of the present invention.

With reference now to FIG. 2, there is depicted a high-level logic flow diagram of a method for processing graphics simulation data, in accordance with a preferred embodiment of the present invention. Initially, requirements for visual simulation are defined, as shown in block 51. For example, the basic layout of the desired visual simulation, the desired three dimensional (3D) visual models, the simulation data, the user interaction (i.e., how to control the simulation playback and observer viewpoint), and the display requirements (i.e., update rates, output format and size, etc.) are defined. Then, various 3D visual models to be rendered in visual simulation are built, as depicted in block 52. The 3D visual models to be rendered in the visual simulation may include objects such as airplanes, terrain, people, etc. Next, data that are utilized to move and control elements of the visual simulation are built, as shown in block 53. Instead of building, such data can also be acquired from various sources such as engineering analysis, recorded flight test or flight simulation, etc. The built or acquired data are then converted to an object oriented format, such as a General Exchange of Methods and Data (GEMD) format, as depicted in block 54. The built or acquired data has to be converted to the object oriented format in order to remove the burden of writing custom code for each unique visual simulation, as it is done in the prior art. A linkage between the object oriented data, such as GEMD data, and the elements of the visual simulation is then established, as shown in block 55. The remaining visual simulation attributes are then defined, as depicted in block 56. The remaining visual simulation attributes define the rest of the details such as clouds, fogs, initial viewpoint, etc., for the visual simulation. Finally, the visual simulation software is executed, as shown in block 57.

For use in data processing system 10 (from FIG. 1), an object oriented GEMD file preferably includes three object types, namely, a dataset object, a table object, and a function object. A sample object oriented GEMD file is depicted as follows.

```
dataset d_gemd_sample
    indvar time
    depvar x y z h p r
{
    function f_to_vega
        indvar time xloc yloc alt psi theta phi
        depvar x y z h p r
    {
        x = yloc / 3.281;
        y = -xloc / 3.281;
        z = -alt / 3.281;
        h = psi * 180 / 3.14159;
        p = theta * 180 / 3.14159;
        r = phi * 180 / 3.14159;
    }
    table t_data
        indvar time
        depvar xloc yloc alt psi theta phi
    {
            time    xloc    yloc    alt    psi    theta    phi
            0       0       0       5000   5      3        45
            0.1     99      14      5060   4      2        34
            1       212     135     5030   3      3        4
            ...
            100     980     432     3500   9      -3       -55
    }
}
```

For the linkages (in block 55 of FIG. 2) to work, the top level object in the object oriented GEMD file has to be a dataset and has to have a unique dataset name. The above-shown sample object oriented GEMD file provides a dataset with the name of d_gemd_sample. The top level independent variable is the variable that receives the time from the simulation. The top level dependent variables are those that are used by the simulation to control a simulation element. An object oriented GEMD dataset, by definition, includes other datasets, tables, or functions. These included datasets, tables, or functions, will heretofore be referred to as lower level objects. The top level independent variable may then propagate to these lower level objects as needed to calculate the dependent variables to control a simulation element. For the provided GEMD file sample, time is an independent variable for all objects; however, it is not a requirement that all lower level objects have time as an independent variable. Certain lower-level objects may require other independent variables from other lower-level objects. In this example, a function is needed to convert the source data into units used by the visual simulation. Therefore, the above-shown object oriented GEMD sample file uses a function called f_to_vega to take the source data and make the necessary conversions. Again, the independent variables have to be identified and in this example, it is not only time, but the source data variables that will need to be converted. The lower level dependent variables are the resulting outputs from the lower level objects that in turn propagate results up to the top level object. In the above-shown object oriented GEMD sample, the x and y values are swapped, and converted from feet to meters. For the heading, pitch and roll variables (such as h,p, and r) are included with radian converted to degree.

An object oriented GEMD table is defined with the name of t_data with the independent variable of time and the dependent variables being the original source data. Often the table is kept in a separate file and uses a GEMD convention of "# include" to point to that file so that it does not have to be edited with the header information. In the end, it is the definition of independent and dependent variables that define the way GEMD automatically determines dependencies and order of operations in order to generate the top level dependent variables based on the top level independent variable.

The steps for converting raw source data into GEMD format (as depicted in block 54 of FIG. 2) are as follows:

(A) If the data is in a tabular format, then
  1. create new file;
  2. add a GEMD table header and name;
  3. add an indvar declaration to identify time variable in the GEMD table;
  4. add a depvar declaration to identify dependent variables in the GEMD table;
  5. add an open brace "{";
  6. add a list of table variables;
  7. include tab or space delimited table of numbers; and
  8. add a close brace "}".

The resulting file is then either be directly added to the GEMD file that contains the data source definition, or it can be referenced by using the GEMD "# include" directive.

(B) If the data is in the form of an equation or set of equations, then
  1. create a new file;
  2. add a GEMD function header and name;
  3. add an indvar declaration to identify time variable in the GEMD table;
  4. add a depvar declaration to identify dependent variables in the GEMD table;
  5. add an open brace "{";
  6. add equations using C/C++like GEMD syntax; and
  7. add an close brace "}".

As with the GEMD table in (A) above, the function can be directly added to the parent dataset or referenced via "# include" directive.

The steps for establishing linkage between the GEMD data and the visual simulation elements (as depicted in block 55 of FIG. 2) are as follows. The "DataSource" must be identified first and it defines the GEMD file and the associated top level dataset variables that will be utilized to control the visual simulation elements by
  1. identify the GEMD file to be used;
  2. identify the independent time variable; and
  3. identify the list of dependent variables.

Next, the visual simulation elements that are to be controlled by the GEMD variables must be linked by identifying the required parameters. This linkage is known as the "DataPipe," as follows:
1. identify GEMD DataSource;
2. identify type of visual simulation element to control (e.g., player position, control surface deflection, enabling/disabling symbology, etc.);
3. identify specific element in simulation to control (e.g., which player, which control surface, etc.); and
4. identify the GEMD variables necessary to enable the manipulation of the visual simulation element (some require only one variable, others might use nine or more).

After the linkage has been defined by the user, data processing system 10 automatically creates and associates specific controlling functions with the identified GEMD variables and visual simulation elements. This step occurs at the initiation of the visual simulation application. Then, at run-time, before each frame is rendered, the controlling function is invoked that calculates the necessary information based on the associated GEMD variables. Once this is done for each DataPipe, a single frame is rendered. The steps associated with this activity are as follows. At initialization, for each DataPipe:
1. gather DataPipe parameters defined for controlling visual simulation element;
2. establish controlling function appropriate for specified visual simulation element;
3. link defined GEMD variables into controlling function; and
4. register controlling function to execute prior to the rendering of each frame.

At run-time, prior to rendering each frame, each registered controlling function for all DataPipes is executed prior to rendering frame and the frames are rendered.

As has been described, the present invention provides a method and system for processing graphics simulation data within a data processing system. The present invention provides the capability of using a graphical user interface to define specific GEMD data (variables) and how they control individual elements of the visual simulation. Specifically, GEMD data can control an object's position, a DOF head position (allows articulation of individual pieces of an object), dynamic text displays, turning on and off specific elements, turning on and off sounds, etc. Using such capability, a wide variety of data and simulation elements can be controlled without having to rewrite and recompile any software, nor do simulation elements require a rigid construction format or naming convention.

In the drawings and specification, there have been disclosed embodiments of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the attached claims.

What is claimed is:

1. A method for processing graphics simulation data within a data processing system, said method comprising:
constructing a plurality of three-dimensional visual models to be rendered in a graphics simulation;
acquiring data that are utilized to move and control controllable elements of said graphics simulation;
converting said acquired data to an object oriented format having tables and functions defining an object oriented file by automatically resolving dependencies and order of operations between independent and dependent variables to generate top-level dependent variables based on a top-level independent variable, the top-level independent variable including time, the top-level dependent variables controlling controllable elements of said graphics simulation, the object oriented format being a GEMD format;
establishing a link between said data in said object oriented file and said controllable elements of said graphics simulation;
processing said data in said object oriented file via said graphics simulation; and
displaying said graphics simulation.

2. The method of claim 1, wherein said method further includes the step of defining requirements for the graphics simulation, and wherein the step of defining requirements for a graphics simulation includes the steps of defining a basic layout of the graphics simulation, desired three-dimensional visual models to be used, simulation data to be acquired, user interaction requirements, and display requirements.

3. The method of claim 1, wherein said functions are objects, wherein the processing system includes an information source having a model library contained therein, the model library including a plurality of models comprised of a plurality of objects, and wherein the method further comprises sequentially updating each object of a selected model to obtain output values for each of the objects substantially without performing redundant calculations.

4. The method of claim 1, wherein the step of establishing a link includes the steps of identifying the object oriented file, top-level independent and dependent variables, type of visual simulation element to control, specific element in simulation to control, and top-level dependent variables necessary to enable manipulation of the visual simulation element.

5. A computer readable medium including a computer program product for processing graphics simulation data, said computer program product comprising:
program code means for constructing a plurality of three-dimensional visual models to be rendered in a graphics simulation;
program code means for acquiring data that are utilized to move and control controllable elements of said graphics simulation;
program code means for converting said acquired data to an object oriented format having tables and functions defining an object-oriented file, automatically resolving dependencies between lower level independent and dependent variables to generate top-level dependent variables based on a top-level independent variable, the top-level independent variable including time, the top-level dependent variables controlling controllable elements of said graphics simulation, the object oriented format being a GEMD format;
program code means for establishing a link between said data in said object oriented file using said independent and dependent variables and said controllable elements of said graphics simulation; and
program code means for processing said data in said object oriented file via said graphics simulation.

6. The computer program product of claim 5, wherein said computer program product further includes program code means for defining requirements for the graphics simulation, and wherein the program code means for defining requirements for the graphics simulation includes program code means for defining a basic layout of the graphics simulation, desired three-dimensional visual models to be used, simulation data to be acquired, user interaction requirements, and display requirements.

7. The computer program product of claim 5, wherein said functions are objects, and wherein the computer program product includes program code means for accessing an information source including a model library having a plurality of models comprised of a plurality of objects, and program code means for sequentially updating each object of a selected model to obtain output values for each of the objects substantially without performing redundant calculations or modifying original source data values.

8. The computer program product of claim 5, wherein the program means for establishing a link further includes program means for identifying the object oriented file, top-level independent and dependent variables, type of visual simulation element to control, specific element in simulation to control, and top-level dependent variables necessary to enable manipulation of the visual simulation element.

9. A data processing system for processing graphics simulation data, said data processing system comprising:
means for constructing a plurality of three-dimensional visual models to be rendered in a graphics simulation;
means for acquiring data that are utilized to move and control controllable elements of said graphics simulation;
means for converting said acquired data to an object oriented format having tables and functions defining an object oriented file, automatically resolving dependencies and order of operations between lower level independent and dependent variables to generate a top-level dependent variable based on a top-level independent variable, the top-leve independent variable including time, the top-level dependent variables controlling controllable elements of said graphics simulation, the object oriented format being a GEMD format;
means for establishing a link between said data in said object oriented file and said elements of said graphics simulation; and
means for processing said data in said object oriented file via said graphics simulation.

10. The data processing system of claim 9, wherein said data processing system further includes means for defining requirements for a graphics simulation, and wherein the means for defining requirements for a graphics simulation include means for defining a basic layout of the graphics simulation, desired three-dimensional visual models to be used, simulation data to be acquired, user interaction requirements, and display requirements.

11. The data processing system of claim 9, wherein said functions and said tables are objects, the data processing system further comprising:
an information source including a model library having a plurality of models comprised of a plurality of objects; and
an update engine positioned to access the information source to sequentially update each object of a selected model in the model library to obtain output values for each of the objects substantially without performing redundant calculations or modifying original source data values.

12. The data processing system of claim 9, wherein the means for establishing a link includes means for identifying the object oriented file, top-level independent and dependent variables, type of visual simulation element to control, specific element in simulation to control, and top-level dependent variables necessary to enable manipulation of the visual simulation element.

13. A method for processing graphics simulation data within a data processing system, said method comprising:
defining requirements for a graphics simulation;
constructing a plurality of three-dimensional visual models to be rendered in the graphics simulation;
acquiring data that are utilized to move and control controllable elements of the graphics simulation;
converting said acquired data to an object oriented format having tables and functions defining an object oriented file, automatically resolving dependencies and order of operations between lower level independent and dependent variables to generate top-level dependent variables based on a top-level independent variable, the top-level independent variable including time, the top-level dependent variables controlling at least one of the controllable elements of said graphics simulation, the object oriented format being a GEMD format;
establishing a link between said data in said object oriented file and said elements of said graphics simulation by identifying the object oriented file, top-level independent and dependent variables, type of visual simulation element to control, specific element in simulation to control, and top-level dependent variables necessary to enable manipulation of the visual simulation element;
processing said data in the object oriented file via the graphics simulation; and displaying said graphics simulation.

14. The method of claim 13, wherein the object oriented file defines a data set object, and includes a table object and function objects, the defining data set object encapsulating or referencing a set of source data in its original form and the function object translating the source data into the object-oriented format.

15. The method of claim 13, wherein the object-oriented file is a GEMD file having a top-level object, and wherein the top-level object must be a dataset having a unique dataset name.

16. The method of claim 13, wherein the step of defining requirements for a graphics simulation include defining a basic layout of the graphics simulation, desired three-dimensional visual models to be used, simulation data to be acquired, user interaction requirements, and display requirements, wherein the processing system comprises an information source including a model library having a plurality of models including a plurality of objects, and wherein the method further comprises sequentially updating each object of a selected model to obtain output values for each of the objects substantially without performing redundant calculations.

* * * * *